United States Patent
Chang et al.

(10) Patent No.: US 7,192,832 B2
(45) Date of Patent: Mar. 20, 2007

(54) FLASH MEMORY CELL AND FABRICATING METHOD THEREOF

(75) Inventors: Ko-Hsing Chang, Hsinchu (TW); Hann-Jye Hsu, Taichung Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 272 days.

(21) Appl. No.: 10/711,535

(22) Filed: Sep. 24, 2004

(65) Prior Publication Data

US 2005/0042826 A1 Feb. 24, 2005

Related U.S. Application Data

(62) Division of application No. 10/604,861, filed on Aug. 22, 2003, now Pat. No. 6,815,758.

(51) Int. Cl.
*H01L 21/336* (2006.01)
(52) U.S. Cl. .................. 438/259; 438/257; 438/258
(58) Field of Classification Search ............ 438/259, 438/258, 257
See application file for complete search history.

(56) References Cited

U.S. PATENT DOCUMENTS

| | | | | |
|---|---|---|---|---|
| 5,616,510 A * | 4/1997 | Wong | ............ | 438/259 |
| 5,773,343 A * | 6/1998 | Lee et al. | ............ | 438/259 |
| 6,093,606 A * | 7/2000 | Lin et al. | ............ | 438/259 |
| 6,127,226 A * | 10/2000 | Lin et al. | ............ | 438/259 |
| 6,239,465 B1 * | 5/2001 | Nakagawa | ............ | 257/331 |
| 6,444,525 B1 * | 9/2002 | Lee | ............ | 438/259 |
| 6,448,605 B1 * | 9/2002 | Chang | ............ | 257/314 |
| 6,794,250 B2 * | 9/2004 | Chang et al. | ............ | 438/259 |
| 6,800,895 B2 * | 10/2004 | Chang et al. | ............ | 257/316 |
| 6,815,758 B1 * | 11/2004 | Chang et al. | ............ | 257/315 |
| 6,893,921 B2 * | 5/2005 | Ding | ............ | 438/259 |
| 6,936,883 B2 * | 8/2005 | Chen et al. | ............ | 257/315 |
| 6,979,859 B2 * | 12/2005 | Hofmann et al. | ............ | 257/315 |
| 7,022,573 B2 * | 4/2006 | Hsiao et al. | ............ | 438/259 |
| 7,075,148 B2 * | 7/2006 | Hofmann et al. | ............ | 257/331 |
| 2001/0029077 A1 * | 10/2001 | Noble et al. | ............ | 438/257 |
| 2002/0052103 A1 * | 5/2002 | Chang | ............ | 438/593 |
| 2004/0183121 A1 * | 9/2004 | Yeh et al. | ............ | 257/315 |
| 2005/0012137 A1 * | 1/2005 | Levi et al. | ............ | 257/315 |
| 2005/0042826 A1 * | 2/2005 | Chang et al. | ............ | 438/258 |
| 2006/0146640 A1 * | 7/2006 | Kim | ............ | 365/232 |

\* cited by examiner

*Primary Examiner*—Laura M. Schillinger
(74) *Attorney, Agent, or Firm*—Jiang Chyun IP Office

(57) ABSTRACT

A flash memory cell and a method for fabricating the same are described. The flash memory cell comprises a substrate, a select gate, a floating gate, a gate dielectric layer, a high-voltage doped region and a source region. The substrate has a first opening thereon and a second opening in the first opening. The select gate is on the sidewall of the first opening, and the floating gate is on the sidewall of the second opening. The gate dielectric layer is between the select/floating gate and the substrate. The high-voltage doped region is in the substrate under the second opening, and the source region is in the substrate beside the first opening. In the method of fabricating the flash memory cell, the select gate and the floating gate are simultaneously formed on the side walls of the first opening and the second opening, respectively.

10 Claims, 2 Drawing Sheets

FLASH MEMORY CELL AND FABRICATING METHOD THEREOF

CROSS-REFERENCE TO RELATED APPLICATION

This application is a divisional application of U.S. application Ser. No. 10/604,861, filed on Aug. 22, 2003 now U.S. Pat. No. 6,815,758.

BACKGROUND OF THE INVENTION

1. Field of Invention

The present invention relates to a structure and method of fabricating a semiconductor device. More particularly, the present invention relates to a structure and method of fabricating a flash memory cell.

2. Description of Related Art

A typical flash memory cell includes a stacked structure of a control gate and a floating gate, and a source/drain region on two sides of the structure, where the control gate and the floating gate are generally constructed of polysilicon. In a conventional method of process of a flash memory cell, a positive high voltage is applied, in a programming mode, to a control gate to cause electrons injecting to a floating gate so that the channel under the floating gate is turned off in a reading operation; while a negative high voltage is applied, in an erasing mode, to the control gate to cause electrons ejecting from the floating gate so that the channel under the floating gate is turned on in a reading operation. Data in the memory cell are judged by whether the channel is turned on.

However, over-erase often occurs in a process to erase a flash memory cell. In other words, too much electrons eject from the floating gate to cause the floating gate carrying positive charges, and thus the channel under the floating gate will have electron leakage; when the over-erase becomes more significant, the channel may even stay in an on-state to seriously interfere reading operation of other memory cells. To solve such problems, prior art provides a split-gate design, i.e., by constructing a select gate beside the floating gate and separating the select gate from a substrate with a gate oxidation layer, under which another channel for the memory cell is formed. Thus, when the channel under the floating gate continues to be turned on due to over-erase, the select gate beside the floating gate will have a function to turn on or off the channel of the memory cell. The select gate is mostly constructed of polysilicon and is patterned simultaneously with the control gate.

Even though the split-gate design in prior art may effectively avoid problems caused by over-erase, the split gate fabricating process requires two deposition steps to deposit polysilicon and thus is time consuming since the select gate is formed after the formation of the floating gate.

SUMMARY OF THE INVENTION

The present invention is to provide a structure of a flash memory cell with a split-gate design to avoid various problems caused by over-erase of the floating gate, and formation of the structure requires only a single step of polysilicon deposition.

The present invention is also to provide a fabricating method which requires only a single step of polysilicon deposition in the process to form the split gate for saving time and costs.

The flash memory cell of the present invention includes a substrate, a select gate, a floating gate, a gate dielectric layer, a high-voltage doped region and a source region. There is a first opening in the substrate and further, there is a second opening on the bottom of the first opening in the substrate. The second opening is narrower than the first opening, while the second opening is deeper, as measured from the surface of the substrate, than the first opening. The select gate is on the sidewall of the first opening, and the floating gate is on the sidewall of the second opening. The gate dielectric layer is between the select/floating gates and the substrate. The high-voltage doped region is under the bottom of the second opening in the substrate, and the source region is formed besides the first opening in the substrate. The high-voltage region is simultaneously used as control gate and drain region.

The above flash memory cell of the present invention can further include an insulating layer and a contact plug, where the insulating layer is on the top of the substrate and covers the select gate and the floating gate. The contact plug penetrates through the insulating layer and is electronically connected to the high-voltage doped region to supply high voltage to the high-voltage doped region.

The method of fabricating the flash memory cell of the present invention includes the following steps. First, a substrate is provided and a first opening and a second opening are formed in the substrate, where the second opening is formed on the bottom of the first opening in the substrate. The second opening is narrower than the first opening, while the second opening is deeper, as measured from the surface of the substrate, than the first opening. A high-voltage doped region is formed under the bottom of the second opening in the substrate, and a gate dielectric layer is formed on the substrate in the first and the second openings. A first conductive spacer is formed as a select gate on the sidewall of the first opening, and a second conductive spacer is formed as a floating gate on the sidewall of the second opening. Additionally, a source region is formed in the substrate beside the first opening.

Furthermore, in the above fabricating process of the flash memory cell of the present invention, after the formation of the source region, an insulating layer is formed on the substrate to cover the select gate and the floating gate. A contact plug, which penetrates through the insulating layer and is electronically connected to the high-voltage doped region, can also be formed to supply high voltage in the high-voltage doped region.

As mentioned above, in the fabricating process of the flash memory cell of the present invention, the select gate and the floating gate are simultaneously formed on the sidewalls of the first and the second openings, respectively. Consequently, the fabricating process requires only a single deposition step to form the select gate and the floating gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 shows the structure of a flash memory cell according to the preferred embodiment of the invention.

DESCRIPTION OF THE PREFERRED EMBODIMENTS

The following description to the preferred embodiments of the present invention, as illustrated in the accompanying FIGS. 1–6, is set forth, for the purpose of explanation and not limitation, to provide a thorough understanding of the present invention.

Figure 1:
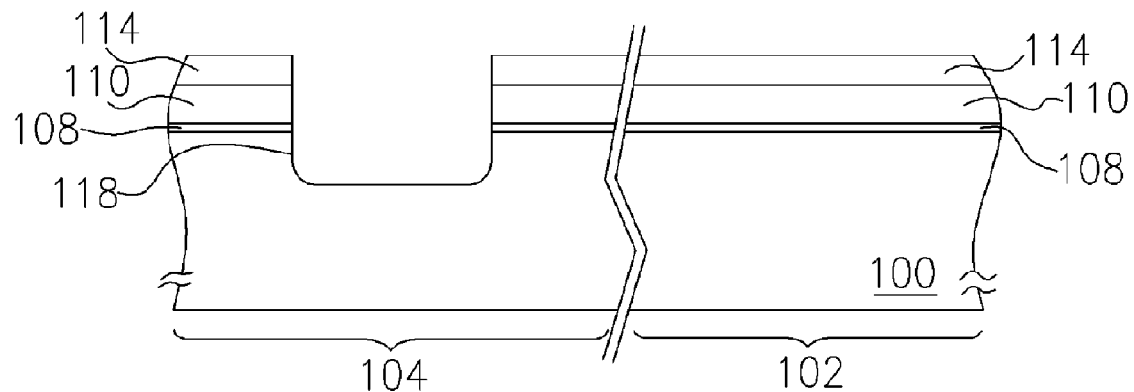
FIGS. 1–6 are cross-sectional views illustrating steps in a fabricating process of a flash memory cell according to a preferred embodiment of the invention, where

Referring to FIG. 1, a substrate 100 is first provided, including a periphery circuit region 102 and a memory cell region 104 thereon. Next, a pad oxide layer 108 and a hard mask layer 110 are in turn formed on substrate 100. The pad oxidation layer 108 is formed, for example, via thermal oxidation. The mask layer 110 is formed with a material, for example, silicon nitride, and through a method, for example, low-pressure chemical vapor phase deposition (LPCVD) with $SiH_2Cl_2/NH_3$ as reacting gases. Further, a patterned photoresist layer 114 is formed on the hard mask layer 110, the exposed hard mask layer 110 is etched with the photoresist layer 114 as mask, and the etching process continues downwards into the pad oxide layer 108 and the substrate 100 to form a first opening 118 in the substrate 100 of the memory cell region 104. During the etching process of the first opening 118, conditions of the polymer formation can be controlled so as to make the bottom of the first opening with round corners, the purpose of which will be briefly explained later.

Figure 2:
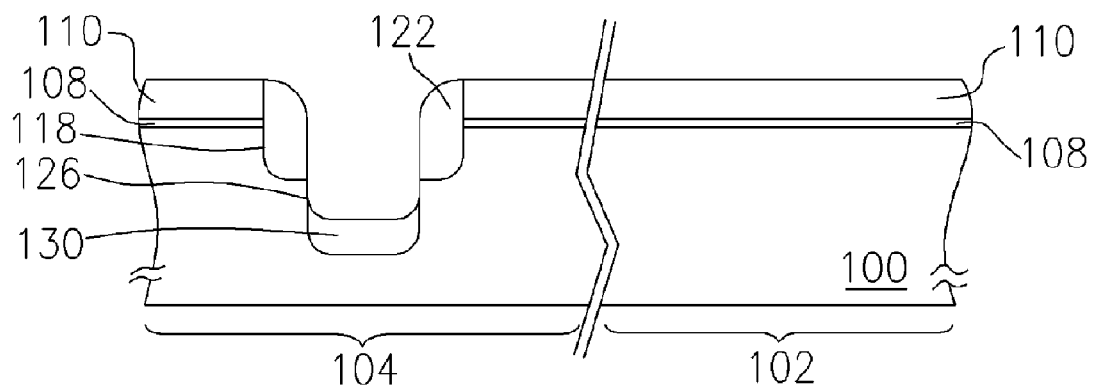

Referring to FIG. 2, residual of the photoresist layer 114 is subsequently removed, and a spacer 122, made of a material such as silicon oxide, is formed on the sidewalls of the mask layer 110 and the first opening 118 in the memory cell region 104. The process to form the spacer 122 is, for example, as follows: a conformal silicon oxide layer (not shown) is formed on the substrate 100 via chemical vapor phase deposition, and then such conformal silicon oxide layer is anisotropically etched back. Next, the exposed substrate 100 is etched, with the mask layer 110 and the spacer 122 as mask, to form a second opening 126 in the substrate 100. As shown in FIG. 2, the second opening 126 is narrower than the first opening 118, but is deeper, as measured from the surface of the substrate 100, than the first opening 118. Further, ion implantation is carried out with the mask layer 110 and the spacer 122 as mask, to form a high-voltage region 130 under the bottom of the second opening 126 in the substrate 100. The high-voltage doped region 130 is simultaneously used as a control gate and a drain region. As described later, such high-voltage doped region 130, as inferred by its name, will be supplied with a high voltage in a programming or erasing mode.

In addition, even though the first opening 118 and the second opening 126 in this embodiment are formed by the method as described above, the fabricating methods are not so limited. For example, these two openings may be formed in a way similar to that to form a dual damascene opening. I.e., the second opening is formed with a depth less than a predetermined value, then a photoresist layer defining the first opening is formed, and further, by etching the substrate, the first opening is formed while the second opening is brought to the predetermined depth.

Figure 3:
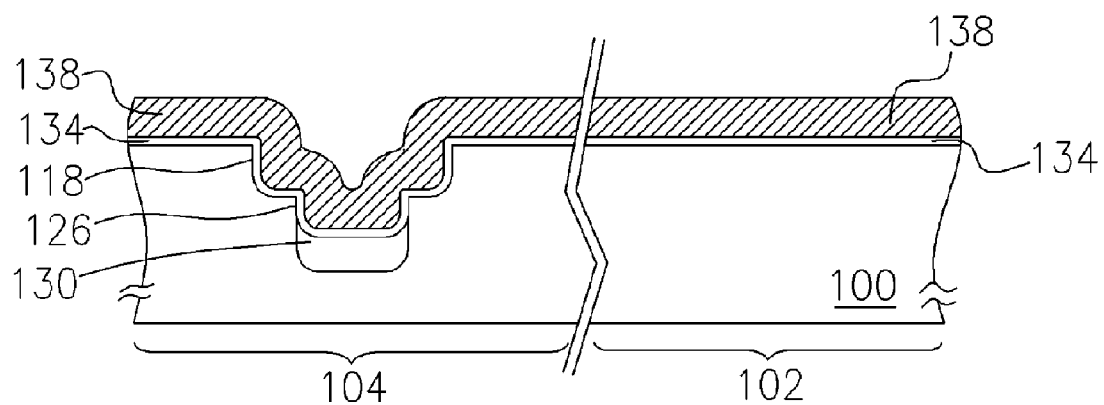

Referring to FIG. 3, the pad oxide layer 108, the mask layer 110 and the spacer 122 are subsequently removed via, preferably, wet etching to prevent damaging the surface of the substrate 100. A gate dielectric layer 134 and a conductive layer 138 are further formed on the substrate 100. The gate dielectric layer 134 is made of materials such as silicon dioxide and by methods such as thermal oxidation. The conductive layer 138 is made of materials such as polysilicon and by methods such as LPCVD with silicomethane ($SiH_4$) as a reacting gas.

Figure 4:
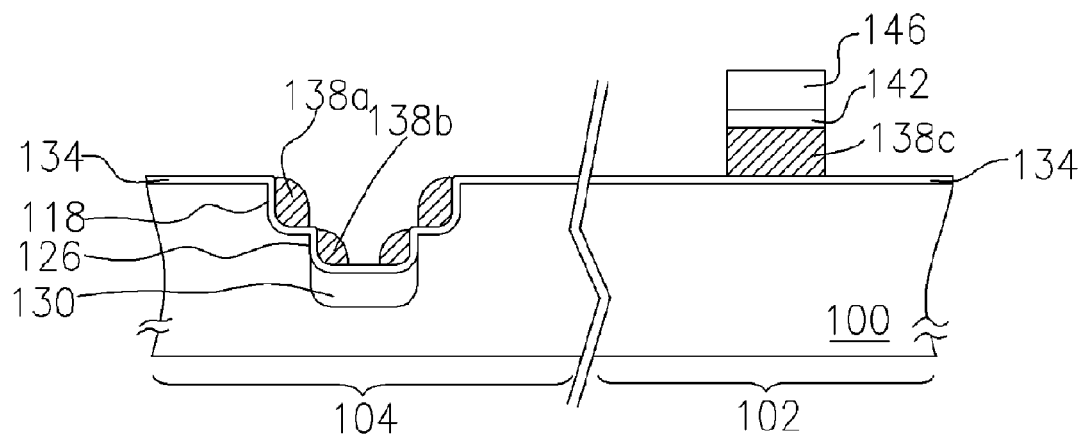

Referring to FIG. 4, an anti-reflection coating (ARC) layer 142 and a photoresist layer 146 which defines patterns of periphery devices are then formed on the polysilicon layer 138 in the periphery circuit region 102. Next, the polysilicon layer 138 is anisotropically etched in order to form simultaneously two select gates 138a on two sidewalls of the first opening 118, two floating gates 138b on two sidewalls of the second opening 126, and the gate 138c of periphery devices in the periphery circuit region 102. In other words, there are two memory cells formed in the first opening 118 and the second opening 126. In addition, since both the first opening 118 and the second opening 126 have round corners on their bottoms, the select gate 138a and the floating gate 138b will not form sharp edges near the substrate 100 and subsequently will not generate excessive electric field causing problems such as electric leakage.

Figure 5:
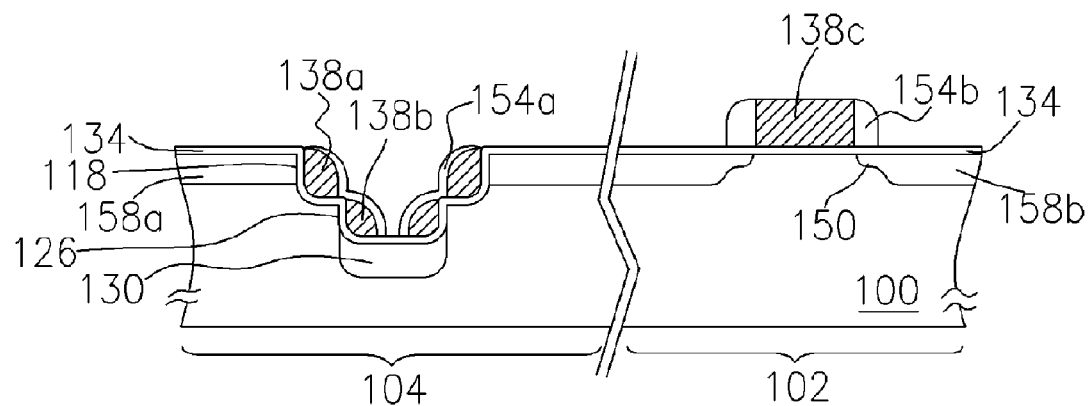

Referring to FIG. 5, an ion implantation is then carried out to form a source/drain extension region 150. Consequently, an insulating spacer 154b is formed on the sidewall of the gate 138c, and an insulating spacer 154a is formed simultaneously on the sidewalls of both the select gate 138a and the floating gate 138b. The insulating spacers 154a and 154b are made with materials such as silicon nitride, and by processes such as forming a conformal silicon nitride layer and then carrying out anisotropic etching. Further, ion implantation is carried out with the select gate 138a, the floating gate 138b and the gate 138c of the periphery devices as mask in order to form simultaneously two source regions 158a of the memory cells and the source/drain region 158b of the periphery devices.

Figure 6:
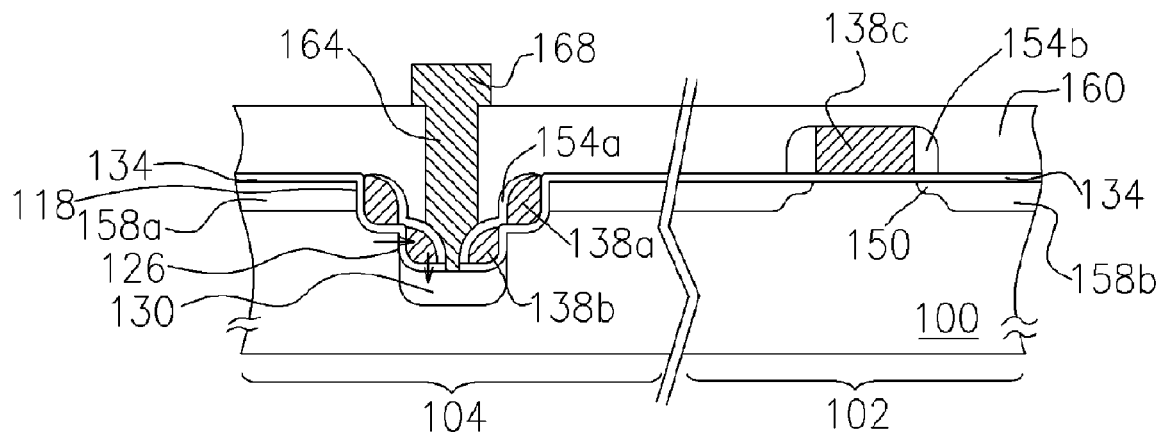

Referring to FIG. 6, an insulating layer 160 is then formed on the substrate 100. The insulating layer 160 may be made of materials such as silicon oxide produced via methods such as plasma electron chemical vapor deposition (PECVD). Consequently, a contact plug 164, which penetrates through the insulating layer 160 and the gate dielectric layer 134 and is connected electronically with the high-voltage doped region 130, is formed, and a wire line 168 is formed above the insulating layer 160. During the process to form the contact plug 164, the insulating spacer 154a, made of silicon nitride, can protect the floating gate 138b so as to prevent it from shorting with the contact plug 164. In such a programming/erasing mode of the flash memory cell, the high voltage, required in the high-voltage doped region, is provided through the wire line 168 and the contact plug 164.

Additionally, even though in the present embodiment of the invention the contact plug 164 above the memory cell is connected electrically with the high-voltage doped region 130 to provide the requisite high voltage for the operation, when the high-voltage doped region is formed with a embedded wire line, the contact plug 164 is then not required to be formed above every memory cell but only at the line terminal of the high-voltage doped region 130.

Further referring to FIG. 6, the high-voltage doped region 160 in a flash memory cell of the invention is simultaneously used as a control gate and a drain region. More particularly, in such a programming mode of the flash memory cell, when a high voltage is applied to the high-voltage doped region 130 under the bottom of the second opening 126, a sufficient voltage will be induced in the floating gate 138b on the sidewall of the second opening 126 to turn on the channel on the sidewall of the substrate 100. Under such a circumstance, if turning on the channel on the sidewall of the select gate 138a on the substrate 100 and applying a low voltage on the source region 158a, electrons will inject to the high-voltage doped region 130 from the source region 158a, whereas a part of which will inject into the floating gate 138b, as indicated by the horizontal arrow. The above method is called as channel hot electron injection (CHEI). On the other hand, in an erasing mode, a high voltage is applied to the high-voltage doped region 130 to cause electrons in the floating gate 138b injecting, under Fowler-Nordheim channeling effect, to the high-voltage doped region 130, as indicated by the vertical arrow.

As described above, in the preferred embodiment of the present invention, the select gate and the floating gate of the flash memory cell are formed simultaneously on the sidewalls of the first opening and the second opening, respectively, via a method of deposition and etching back of conductive materials, so that only a single deposition step is required to form the select gate and the control gate in a fabricating process of the split gate.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a flash memory cell, comprising the following steps:
    providing a substrate;
    forming a first opening and a second opening in the substrate, wherein the second opening is formed on the bottom of the first opening, the second opening is narrower but is deeper, as measured from the surface of the substrate, than the first opening;
    forming a high-voltage doped region under the bottom of the second opening in the substrate;
    forming a gate dielectric layer on the substrate in the first opening and the second opening;
    forming a conformal conductive layer on the substrate;
    performing anisotropic etching to the conformal conductive layer to form a first conductive spacer on a sidewall of the first opening as a select gate and a second conductive spacer on a sidewall of the second opening as a floating gate simultaneously; and
    forming a source region beside the first opening in the substrate.

2. The method of fabricating a flash memory cell of claim 1, wherein the step of forming the first opening comprises:
    forming a mask layer with the pattern of the first opening over the substrate; and
    etching the substrate with the mask layer as mask to form the first opening.

3. The method of fabricating a flash memory cell of claim 2, wherein the first opening has round corners on its bottom.

4. The method of fabricating a flash memory cell of claim 2, wherein the step of forming the second opening comprises:
    forming spacers on the sidewalls of the mask layer and the first opening; and
    etching the substrate, with the mask layer and the spacers as mask, to form the second opening.

5. The method of fabricating a flash memory cell of claim 4, wherein the second opening has round corners on its bottom.

6. The method of fabricating a flash memory cell of claim 4, wherein the process to form the high-voltage doped region under the bottom of the second opening in the substrate comprises a step of ion implantation, with the mask layer and the spacer as mask, to the substrate.

7. The method of fabricating a flash memory cell of claim 1, wherein the process to form the gate dielectric layer on the surface of the substrate in the first opening and the second opening comprises thermal oxidation.

8. The method of fabricating a flash memory cell claim 1, wherein the materials of the conformal conductive layer comprise polysilicon.

9. The method of fabricating a flash memory cell of claim 1, the method further comprises:
    forming an insulating layer on the substrate, where the insulating layer covers the select gate and the floating gate; and
    forming a contact plug which penetrates through the insulating layer and is electrically connected with the high-voltage doped region.

10. The method of fabricating a flash memory cell of claim 9, the method further comprises a step, before the formation of the insulating layer, to form an insulating spacer on another sidewalls of the select gate and the floating gate so as to protect the floating gate in the process of forming the contact plug.

* * * * *